(12) United States Patent
Ito et al.

(10) Patent No.: US 11,728,176 B2
(45) Date of Patent: Aug. 15, 2023

(54) TREATMENT METHOD

(71) Applicant: Tokyo Electron Limited, Tokyo (JP)

(72) Inventors: Kiyohito Ito, Miyagi (JP); Shinya Morikita, Miyagi (JP); Kensuke Taniguchi, Miyagi (JP); Michiko Nakaya, Miyagi (JP); Masanobu Honda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/269,602

(22) PCT Filed: Aug. 8, 2019

(86) PCT No.: PCT/JP2019/031343
§ 371 (c)(1),
(2) Date: Feb. 19, 2021

(87) PCT Pub. No.: WO2020/039959
PCT Pub. Date: Feb. 27, 2020

(65) Prior Publication Data
US 2021/0313187 A1  Oct. 7, 2021

(30) Foreign Application Priority Data

Aug. 22, 2018 (JP) .................. 2018-155797

(51) Int. Cl.
*H01L 21/311* (2006.01)
*H01L 21/027* (2006.01)
*H01L 21/3213* (2006.01)

(52) U.S. Cl.
CPC .... *H01L 21/31144* (2013.01); *H01L 21/0271* (2013.01); *H01L 21/32139* (2013.01)

(58) Field of Classification Search
CPC ......... H01L 21/31144; H01L 21/32139; H01L 21/0271; H01L 21/31138; H01L 21/02337
See application file for complete search history.

(56) References Cited

U.S. PATENT DOCUMENTS

| 5,399,533 | A | * | 3/1995 | Pramanik | .......... H01L 21/76819 438/631 |
| 2018/0138078 | A1 | * | 5/2018 | Farrell | ................ H01L 21/0217 |
| 2018/0323061 | A1 | * | 11/2018 | Raley | .................. H01L 21/0228 |

FOREIGN PATENT DOCUMENTS

| JP | H02-012827 | 1/1990 |
| JP | H06-188217 | 7/1994 |
| JP | 2008-016837 | 1/2008 |

OTHER PUBLICATIONS

International Search Report for PCT/JP2019/031343 dated Oct. 21, 2019.

* cited by examiner

*Primary Examiner* — Thomas T Pham
(74) *Attorney, Agent, or Firm* — IPUSA, PLLC

(57) ABSTRACT

A treatment method is provided that includes an embedding step of embedding an organic film in an undercoat film in which a depression is formed; and an etching step of performing etching, after the embedding step, until at least a portion of a top of the undercoat film is exposed.

11 Claims, 10 Drawing Sheets

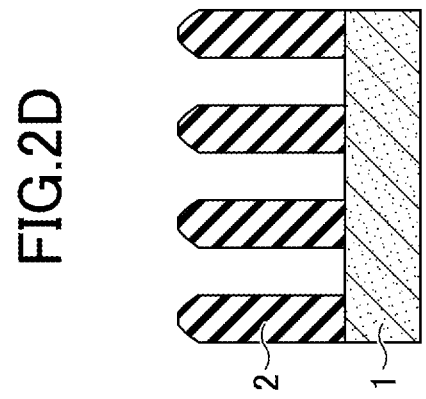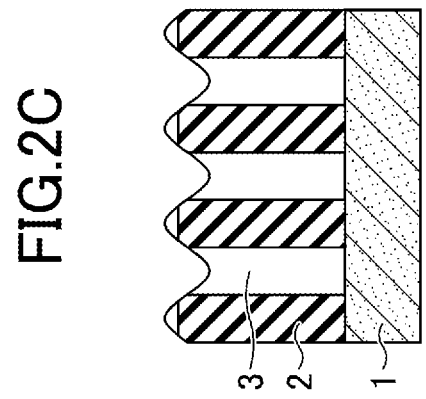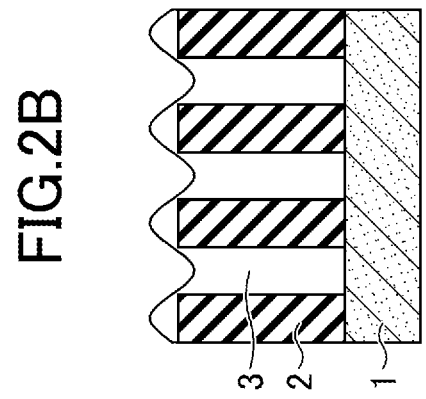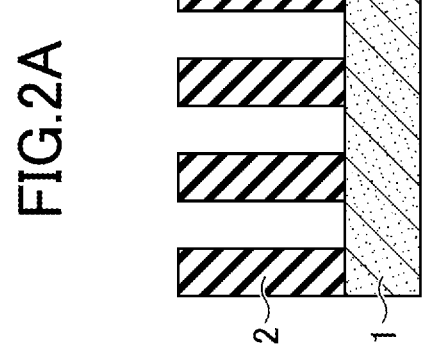

FIG.3

| CONDITION \ TEMPERATURE | -50°C | -40°C | -30°C | -20°C | -10°C |
|---|---|---|---|---|---|
| (a) 100 mTorr C$_4$F$_6$ 300 sccm | OK | — | OK | NG (HAVE VOIDS) | NG (HAVE VOIDS) |
| (b) 50 mTorr IPA (C$_3$H$_8$O) 75 sccm | OK | OK | NG (HAVE VOIDS) | — | NG (HAVE VOIDS) |
| (c) 50 mTorr C$_4$F$_6$ 300 sccm | OK | — | OK | OK | NG (HAVE VOIDS) |
| (d) 50 mTorr C$_4$F$_6$ 125 sccm | — | — | OK | NG (HAVE VOIDS) | NG (HAVE VOIDS) |

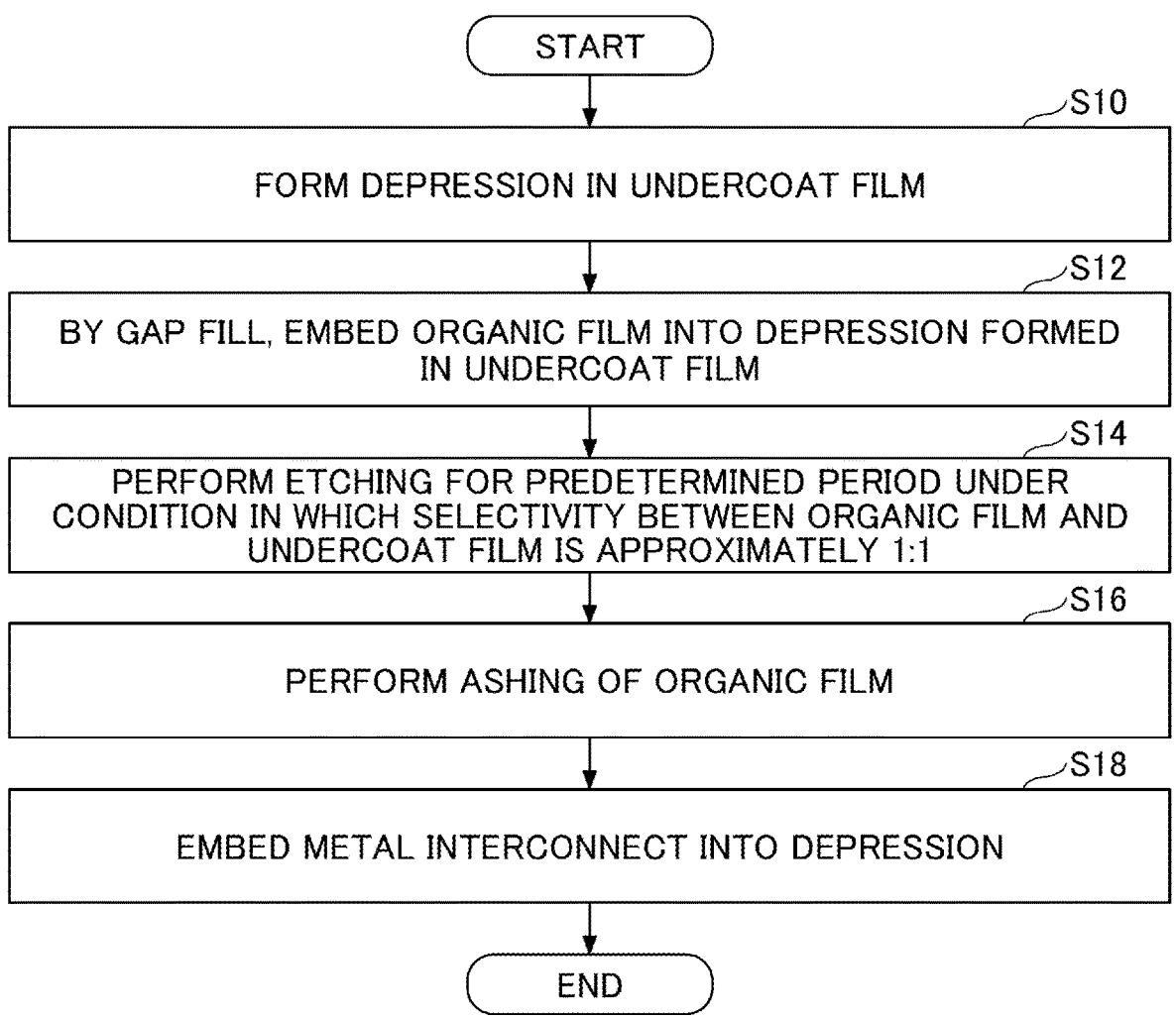

FIG.8

| | INITIAL STATE | COMPARATIVE EXAMPLE | PRESENT EMBODIMENT | |
|---|---|---|---|---|
| FIRST STEP: EMBEDDING ORGANIC FILM | | NOT DONE | DONE | DONE |
| SECOND STEP: ETCHING | | Low Bias (<100 W) | Low Bias (<100 W) | High Bias (>100 W) |
| THIRD STEP: ASHING OF ORGANIC FILM | | NOT DONE | NOT DONE | NOT DONE |
| | Pattern height: 100 nm | 92.1 nm | 98.2 nm | 81.8 nm |
| | Recess: 0.0 nm | 12.8 nm | 0.0 nm | 0.0 nm |

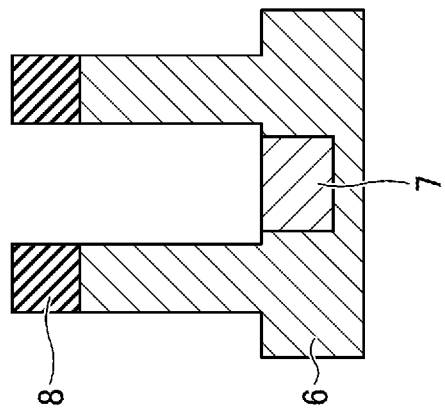
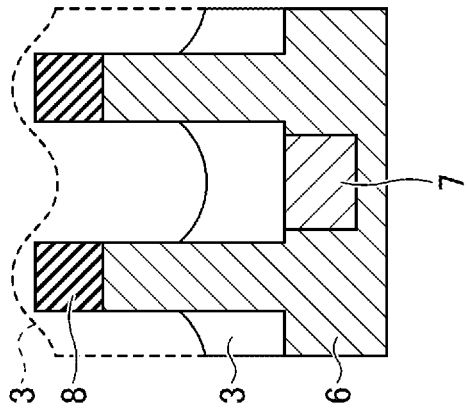
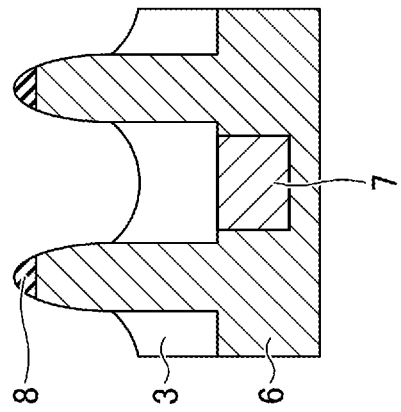
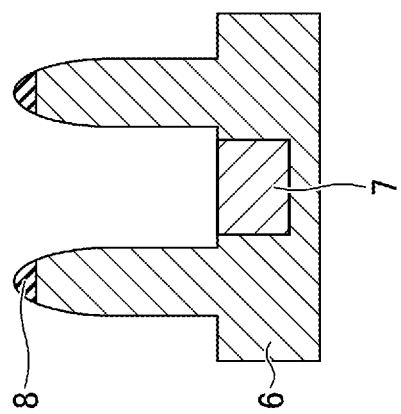

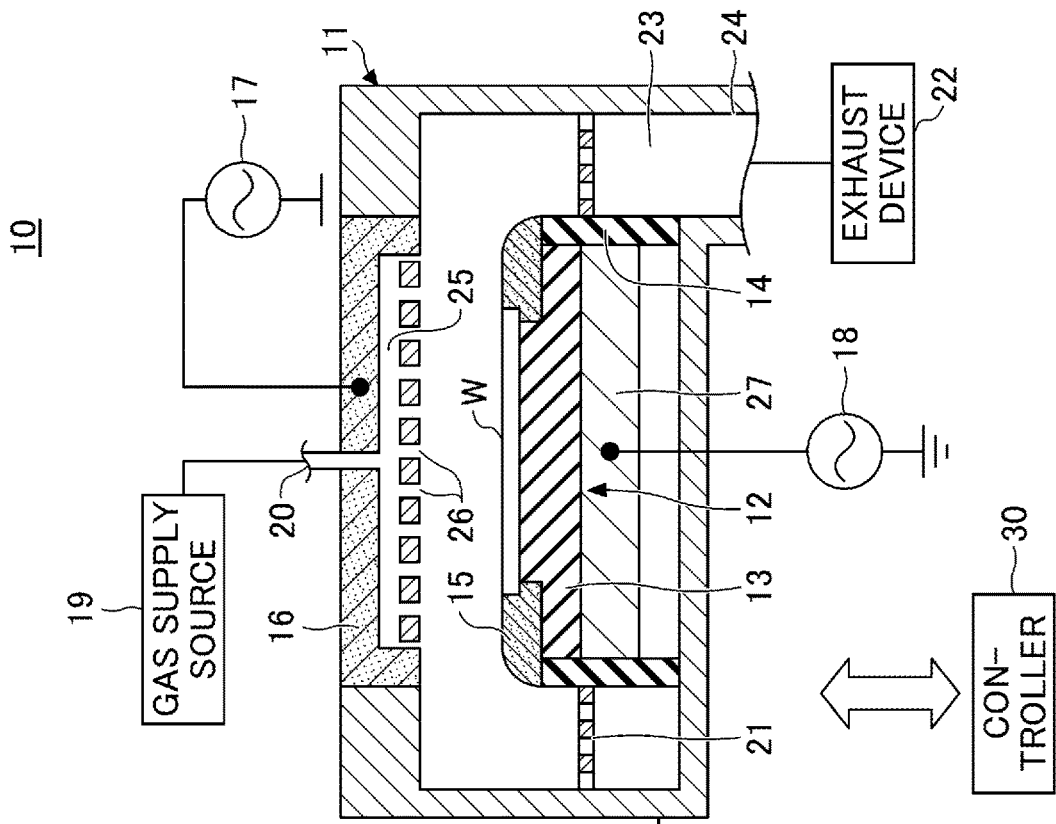
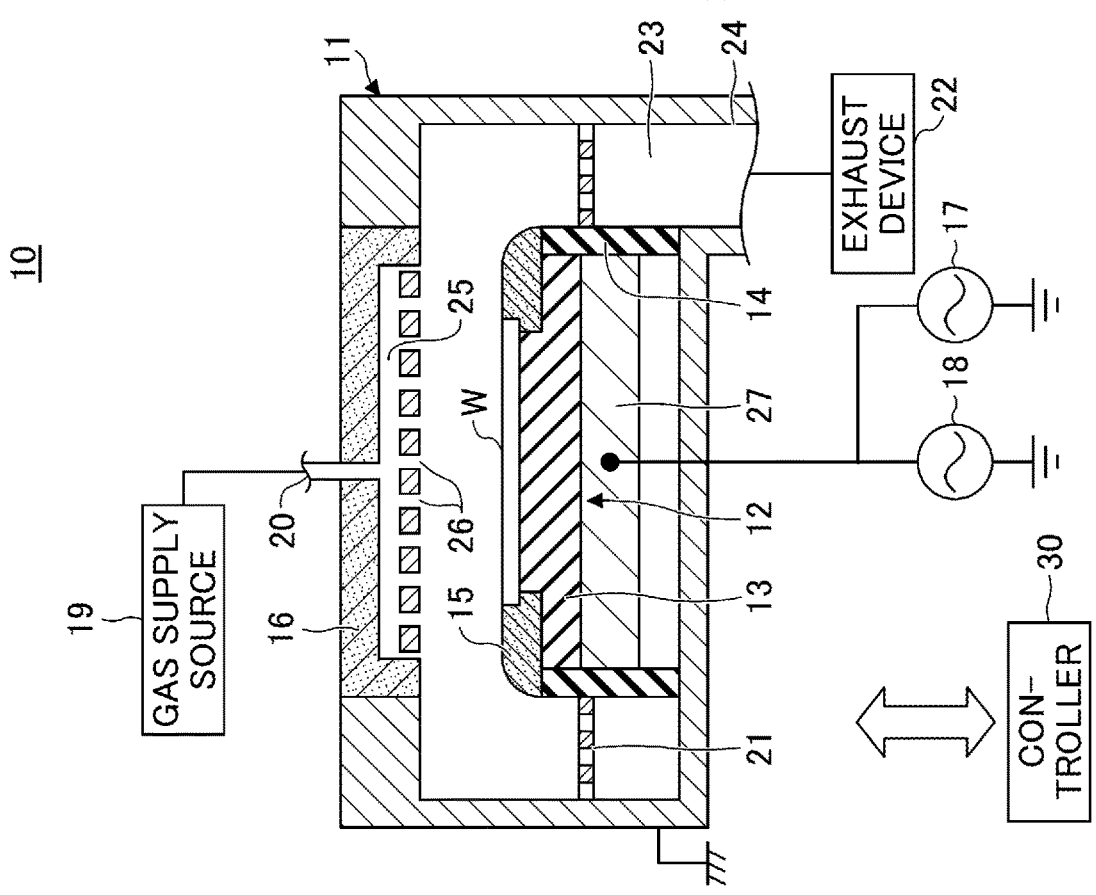

TREATMENT METHOD

TECHNICAL FIELD

The present disclosure relates to a treatment method.

BACKGROUND

For example, Patent Document 1 proposes a technique for forming a shape of a hole, such as a via or a contact, by etching, and for embedding a metal or the like in the hole after forming the hole.

RELATED ART DOCUMENT

[Patent Document]
[Patent Document 1] Japanese Laid-open Patent Application Publication No. 2008-016837

SUMMARY

Problem to be Solved by the Invention

The present disclosure provides a technique for forming a shape that facilitates embedding in depressions.

Means for Solving Problem

According to one aspect of the present disclosure, a treatment method is provided that includes an embedding step of embedding an organic film in an undercoat film in which a depression is formed; and an etching step of performing etching, after the embedding step, until at least a portion of a top of the undercoat film is exposed.

Effect of Invention

According to one aspect, a shape can be formed which facilitates embedding in depressions.

BRIEF DESCRIPTION OF THE DRAWINGS

FIGS. 2A to 2D are diagrams illustrating an outline of a treatment method according to the embodiment;

FIG. 3 is a diagram illustrating an example of results of an experiment regarding temperature dependence of an embedding step according to the embodiment;

FIG. 4 is a flowchart illustrating an example of the treatment method according to the embodiment;

FIG. 8 is a diagram illustrating an example of results of an experiment regarding an etching step according to the embodiment;

FIGS. 9A to 9D diagrams illustrating an example of applying the treatment method to another film; and FIGS. 10A and 10B are diagrams each illustrating an example of a plasma processing apparatus according to the embodiment.

DESCRIPTION OF EMBODIMENTS

Figure 1A:
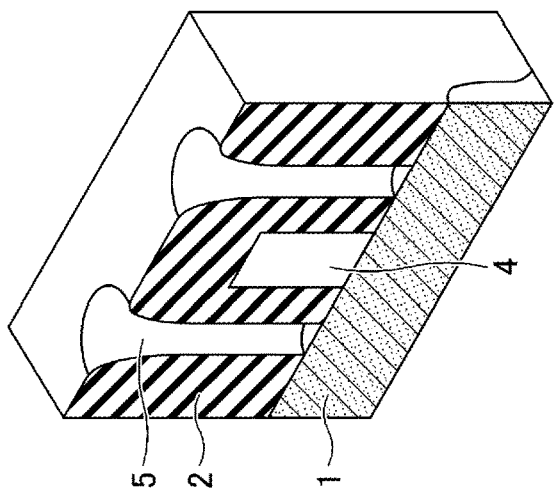
FIGS. 1A to 1F are diagrams illustrating examples of a hole shape according to an embodiment and a comparative example.

Hereinafter, embodiments for carrying out the present disclosure will be described with reference to the drawings. In the present specification and drawings, substantially same structures are indicated by the same reference numerals, and overlapping descriptions may be omitted.

[Hall Shape]

Figure 1B:
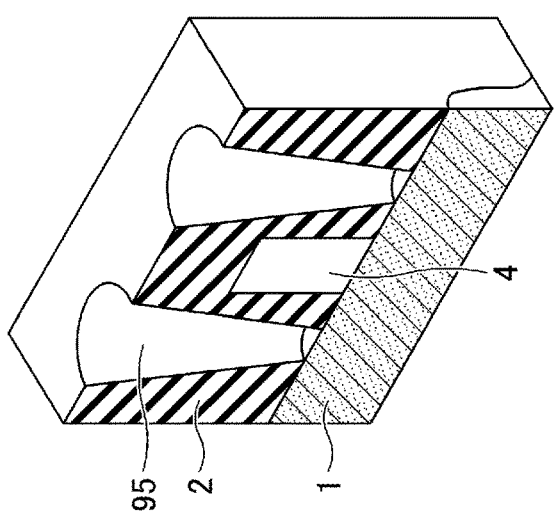

For example, in conventional vias and in conventional etching techniques, although etching in the vertical direction is possible, it was difficult to form a shape of a bole such that only the opening of the hole is tapered. Examples of hole shaves according to comparative examples are illustrated in FIGS. 1A, 1B, 1D, and 1E. FIG. 1D is a cross-sectional view of the shape of holes according to a first comparative example, and FIG. 1A is a perspective view of FIG. 1D. FIG. 1E is a cross-sectional view of the shape of holes according to a second comparative example, and FIG. 1B is a perspective view of FIG. 1E. As illustrated in FIGS. 1A and 1D, diameters of vertically-shaped holes 94 formed by conventional etching methods are small due to recent needs for microfabrication. As a result, openings of the holes 94 have narrowed, and it is difficult to embed metal interconnects or the like in such holes 94.

Meanwhile, as illustrated in FIGS. 1B and 1E, if a hole 95 of a tapered shape that extends from the bottom toward the top is formed, the distance between the active area 4, such as a gate, and the adjacent hole 95 is reduced due to the tapered shape. Therefore, when a conductive material, such as a metal interconnect, is embedded in the hole 95, a problem may occur in which insulating performance with the active area 4 degrades.

Figure 1C:
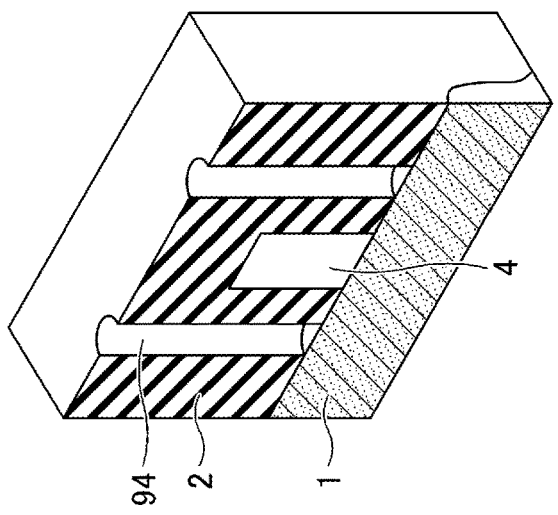
Figure 1D:
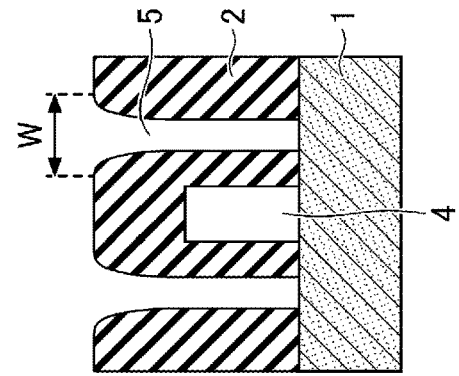
Figure 1E:
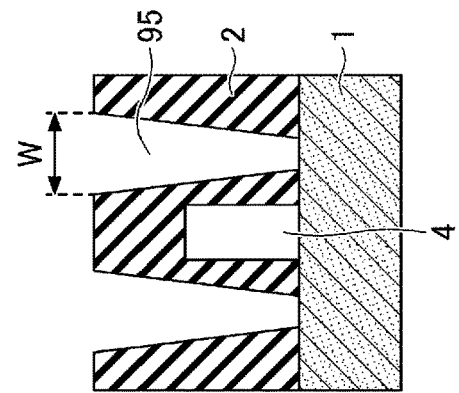
Figure 1F:
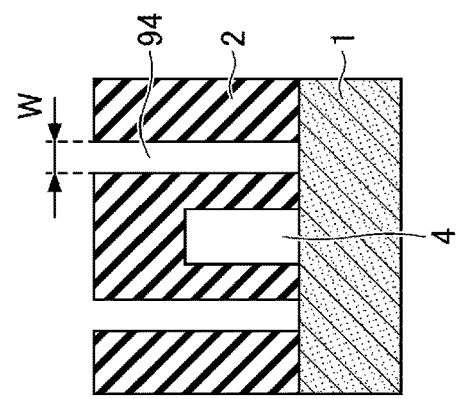

FIGS. 1C and 1F are a set of diagrams illustrating an example of the shape of holes formed by a treatment method according to the present disclosure. FIG. 1F is a cross-sectional view of the holes, and FIG. 1C is a perspective view of FIG. 1F. As illustrated in FIGS. 1C and 1F, if only the opening of a hole 5 of a vertical shape is formed into a tapered shape, embedding a metal interconnect or the like is facilitated. For example, the opening of the hole 5 can be formed into a tapered shape by ion etching. However, in ion etching, as ions collide with the bottom of the hole during etching, the ions cause damage to the bottom of the hole.

Accordingly, the present embodiment proposes a treatment method including an embedding step and an etching step which will be described below. By the treatment method, as illustrated in FIGS. 1C and 1F, the opening of the vertically-shaped hole 5 can be formed into a tapered shape. This allows the tapered opening of the hole 5 to facilitate embedding of the metal interconnect into the hole 5. In addition, because the hole 5 has a vertical shape from the bottom to a height near the opening, or from the bottom to at least the center, it is possible to prevent insulating performance of the hole 5 with the active area 4 from degrading when the metal interconnect is embedded in the hole 5.

[Overview of Embedding Step and Etching Step]

First, an outline of the embedding step and the etching step included in the treatment method according to an embodiment will be described with reference to FIGS. 2A to 2D. FIGS. 2A to 2D illustrate an example of the film configurations formed on a wafer. The treatment method according to the present embodiment includes a forming step of forming depressions in an undercoat film 2 illustrated in FIG. 2A, and an embedding step of embedding an organic film 3 into the depressions in the undercoat film 2 illustrated in FIG. 2B. Further, an etching step of performing etching, after the embedding step, until at least a portion of an upper portion of the undercoat film 2 is exposed as illustrated in FIG. 2C, and a removal step of removing the organic film 3 as illustrated in FIG. 2C by ashing after the etching step, are included.

(Forming Step)

FIG. 2A illustrates an example of the forming step in which the undercoat film 2 is etched using a mask (not illustrated) above the undercoat film 2 to form the depressions in the undercoat film 2 prior to the embedding step of FIG. 2B. In the forming step, etching is performed until a silicon film 1 located under the undercoat film 2 is exposed. The depressions formed in the undercoat film 2 may be a hole having a rounded shape or an elliptical shape, or may be a line shape. The mask may be, for example, a three-layer mask formed of a photoresist, an Si-based anti-reflective layer, and a spin-on-carbon hard mask, or may be a single-layered or multi-layered mask made of a photoresist or other material.

The undercoat film 2 may be a silicon-containing film such as Si, SiC, SIGN, SiN, or $SiO_2$. Alternatively, the undercoat film 2 may be a metal film, a carbon-containing film, or a Low-k film. The undercoat film 2 may be an insulating film or a conductive film. In the present embodiment, an example in which the undercoat film 2 is an insulating film of $SiO_2$ will be described.

(Embedding Step)

FIG. 2B illustrates an example of the embedding step in which the organic film 3 is embedded in the undercoat film 2 in which depressions are formed. Hereinafter, the embedding step may also be referred to as a first step. The embedding step is performed after the mask used in the forming step is removed by ashing. In the present embodiment, the embedding step is performed under the following process conditions. The embedding step uses the gap fill embedding technique or the SOC (Spin On Coat) embedding technique. First, the embedding step using the gap fill embedding technique is described, and subsequently, the embedding step using the SOC embedding technique will be described.

The embedding step using the gap fill embedding technique is performed under the following process conditions.

Process Conditions for Gap Fill Embedding
Pressure in the vacuum vessel: 50 mTorr (approximately 6.65 Pa)
Radio-frequency HF power: 300 W
Radio-frequency LF power: 0 W
Process gas: $C_4F_8$
Temperature of mounting platform: −20° C. or less Accordingly, as illustrated in FIG. 2B, the organic film 3 is embedded in the depressions formed in the undercoat film 2 in a bottom-up manner. When the organic film 3 is embedded by the gap fill under such process conditions, precursors in a plasma generated from $C_4F_8$ gas are deposited in the depressions of the undercoat film 2 and formed in a bottom-up manner. Therefore, voids (gaps) are not appreciably generated in the organic film 3.

Hereinafter, the organic film 3 embedded in the embedding step according to the present embodiment is referred to as a flowable organic film. In other words, under the above-described process conditions, the flowable organic film as an organic film 3 can be embedded in the depressions of the undercoat film 2 without generating voids.

The embedding step according to the present embodiment using the gap fill embedding technology is not limited to the above-described conditions. The embedding step according to the present embodiment may include placing a wafer on a mounting platform cooled to −20° C. or less in a vacuum vessel in which the embedding step according to the present embodiment is performed; supplying, into the vacuum vessel, a process gas containing a gas of a low vapor pressure material; forming the supplied process gas into a plasma; and emitting precursors generated from the low vapor pressure material by the plasma onto the wafer.

(Dependence on Temperature of the Embedding Step)

The temperature dependence of the embedding step will be described with reference to FIG. 3. FIG. 3 is a diagram illustrating an example of results of an experiment regarding temperature dependence of the embedding step according to an embodiment. This experiment was performed under the following process conditions.

Process Conditions of the Experiment of FIG. 3
Pressure in the vacuum vessel: 50 mTorr (approximately 6.65 Pa) or 100 mTorr (approximately 13.3 Pa)
Radio-frequency H F power: 300 W
Radio-frequency LF power: 0 W
Process gas: $C_4F_8$ or IPA (isopropyl alcohol: $C_3H_8O$)
Temperature of mounting platform: −10° C., −20° C., −30° C., −40° C., or −50° C.

Specifically, the row (a) in FIG. 3 illustrates states of an organic film at each temperature when the pressure in the vacuum vessel was maintained at 100 mTorr and $C_4F_6$ gas was supplied at 300 sccm. According to the row (a) in FIG. 3, voids V were generated at −10° C. and −20° C. Meanwhile, at −30° C. and −50° C., a film was formed so as to be stacked from the bottom of the depressions of the silicon film 1, no void V was generated, and the inside of the depressions was filled with the flowable organic film R. No results were obtained when the temperature was −40° C.

The row (b) in FIG. 3 illustrates states of a film at each temperature when the pressure in the vacuum vessel was maintained at 50 mTorr and IPA (isopropyl alcohol) gas was supplied at 75 sccm. IPA is a type of a secondary alcohol. According to the row (b) in FIG. 3, voids V were generated at −10° C. and −30° C., and isotropic film formation was performed. In contrast, at −40° C. and −50° C., no void V was generated, and the depressions were filled with the flowable organic film R. No results were obtained when the temperature was −20° C.

The row (c) in FIG. 3 illustrates states of a film at each temperature when the pressure in the vacuum vessel was maintained at 50 mTorr and $C_4F_6$ gas was supplied at 300 sccm. According to the row (c) in FIG. 3, voids V were generated at −10° C. Voids V were not generated at −20° C., −30° C., and −50° C., and the depressions were filled with the flowable organic film R. No results were obtained when the temperature was −40° C.

The row (d) in FIG. 3 illustrates states of a film at each temperature when the pressure in the vacuum vessel was maintained at 50 mTorr and $C_4F_6$ gas was supplied at 125 sccm. According to the row (d) in FIG. 3, voids V were generated at −10° C. and −20° C. Voids V were not generated at −30° C., and the depressions were filled with the flowable organic film R. Results were not obtained when the temperature was −40° C. and −50° C.

From the above, it has been found that the temperature at which depressions can be filled with the flowable organic film R in a bottom-up manner varies depending on a gas species, pressure, and a gas flow rate. When a pressure of at least 50 mTorr was maintained in the vacuum vessel and $C_4F_6$ gas was supplied at 300 sccm, depressions could be filled with the flowable organic film R at an extremely low temperature of −20° C. or less.

Referring to the process conditions of the embedding step in which $C_4F_8$ gas is supplied to form the organic film 3, in the embedding step, a gas containing at least one of $C_4F_6$ gas, $C_3H_8O$, or $C_4F_8$ gas may be supplied. It is also preferable that the mounting platform is cooled to an extremely low temperature of −20° C. or less, for example, in a range between −20° C. and −60° C.

$C_4F_6$, $C_3H_8O$, and $C_4F_8$ are all low vapor pressure materials. Among these, $C_4F_8$ gas is a gas that reaches vapor pressure at a low temperature under the same pressure. Therefore, it is preferable that a process gas used in the embedding step is a gas that reaches vapor pressure at a temperature equal to or higher than a temperature indicated by the vapor pressure curve of $C_4F_8$, and a carbon-containing gas is preferable because the organic film 3 is deposited.

The embedding step using the gap fill embedding technique is stopped when a predetermined period of time has elapsed and the organic film 3 is deposited on a part or all of the top of the undercoat film 2. The time dependency of the embedding step will be described below. Incidentally, the organic film 3 may preferably be embedded such that the upper surface of the undercoat film 2 is covered with the thin organic film 3 or that a part of the upper surface of the undercoat film 2 is exposed.

(Embedding by SOC)

The embedding step of the organic film 3 may be accomplished by applying the organic material by the SOC (Spin On Coat) using a film forming device such as a coater/developer. In the embedding using SOC, chemicals containing organic acid are supplied, as organic materials, from a nozzle of the coater/developer. The chemicals supplied to a wafer are spread over a main surface of the wafer by centrifugal force associated with rotation of the wafer. Then, volatile components of the chemicals are volatilized by rotation of the wafer and subsequent heat treatment by baking, and the chemicals are solidified or hardened. Accordingly, the organic film 3 is formed in the depressions in the undercoat film 2.

(Etching Step)

FIG. 2C illustrates an example of the etching step in which etching is performed after the embedding step until at least a portion of the top of the undercoat film 2 is exposed. Hereinafter, the etching step may also be referred to as a second step. In the etching step, the undercoat film 2 and the organic film 3 are etched under a condition in which selectivity between the undercoat film 2 and the organic film 3 becomes 1:1 or approximately 1:1. In the present embodiment, the etching step is performed under the following process conditions.

Process Conditions of the Etching Step
Pressure in the vacuum vessel: 10 mTorr pressure (approximately 1.33 Pa)
Radio-frequency HF power: 0 W
Radio-frequency LF power: 500 W
Process gases: $CF_4$, $O_2$, and Ar, or $CF_4$ and $O_2$
Temperature of mounting platform: −60° C.

As a result, the undercoat film 2 and the organic film 3 are etched under the condition in which the selectivity becomes 1:1 or approximately 1:1, and the undercoat film 2 and the organic film 3 are etched by the same thickness. As a result, as illustrated in FIG. 2C, etching is performed until at least a part of the top of the undercoat film 2 is exposed. In the etching step, etching may be performed until at least an edge of the top of the undercoat film 2 is exposed. The etching step may preferably be performed such that the upper portion of the undercoat film 2 becomes rounded.

In the etching step, the undercoat film 2 and the organic film 3 are etched with a gas of Ar, $CF_4$, and $O_2$ or etched with a gas of $CF_4$ and $O_2$. Accordingly, the etching rate of the organic film 3 can be controlled to be almost the same as the etching rate of the undercoat film 2, and the selectivity between the organic film 3 and the undercoat film 2 can be 1:1 or approximately 1:1. The above-described condition with respect to gas is included in the condition in which the selectivity between the organic film 3 and the undercoat film 2 is 1:1 or approximately 1:1.

Also, in the etching step, the organic film 3 and the undercoat film 2 may be sputtered with a noble gas, for example, Ar gas. In that case, the etching step is performed by the following process conditions using a plasma processing apparatus 10.

Process Conditions of Another Type of Etching Step
Pressure in the vacuum vessel: 10 mTorr (approximately 1.33 Pa)
Radio-frequency HF power: 0 W
Radio-frequency LF power: 500 W
Process gas: Ar
Temperature of mounting platform: −60° C.

According to the above-described conditions, the sputtering rate of the organic film 3 and the undercoat film 2 can be controlled to be almost the same, and the selectivity between the organic film 3 and the undercoat film 2 can be approximately 1:1. The above-described condition with respect to gas is included in the condition in which the selectivity between the organic film 3 and the undercoat film 2 is approximately 1:1.

After the etching step and before the next removal step, a step of removing residuum remaining on the surface of the organic film 3 and the undercoat film 2 may be inserted. In this case, the step of removing residuum is performed under the following process conditions in which the selectivity between the organic film 3 and the undercoat film 2 is approximately 1:1.

Pressure in the vacuum vessel: 50 mTorr (approximately 6.65 Pa)
Radio-frequency HF power: 300 W
Radio-frequency LF power: 300 W
Process gases: $CF_4$ and $O_2$
Temperature of mounting platform: −60° C.

According to the above-described conditions, it is possible to remove residuum left on the surface of the organic film 3 and the undercoat film 2. However, this process may be omitted.

(Removal Step)

Returning to FIGS. 2A to 2D, a removal step of FIG. 2D indicates an example of the removal step in which the organic film 3 is removed by ashing of the organic film 3. The removal step is performed by switching to a process condition in which the selectivity of the organic film 3 to the undercoat film 2 is sufficiently large.

Process Conditions of the Removal Step
Pressure in the vacuum vessel: 50 mTorr (approximately 6.65 Pa)
Radio-frequency HF power 500 W
Radio-frequency LF power: 50 W
Process gas: $O_2$
Temperature of mounting platform: −60° C.

According to the above-described conditions, the organic film 3 is removed by an oxygen plasma generated from $O_2$ gas.

In the treatment method according to one embodiment described above, the openings of the depressions can be formed into a tapered shape while retaining a vertical shape of the depressions formed in the undercoat film 2 from the bottom to the vicinity of the openings, as illustrated in FIGS. 1C and 1F, without damaging the undercoat film 2 or the silicon film 1. In the depressions, a metal interconnect is formed in the next process.

[Treatment Method Including Embedding Step and Etching Step]

Figure 5A:
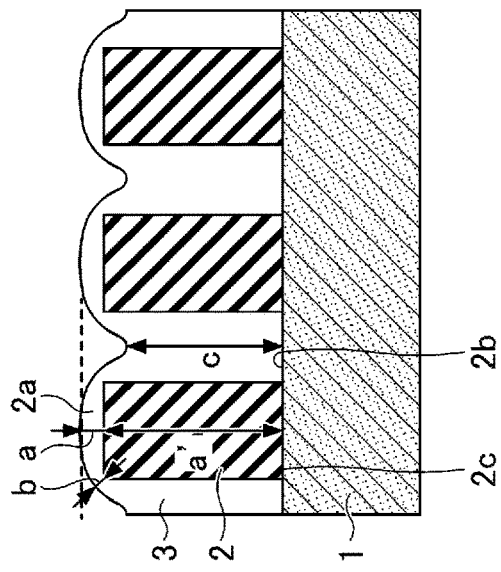
FIGS. 5A to 5C are diagrams illustrating an example of results of an experiment regarding the treatment method according to the embodiment.

Next, the treatment method according to one embodiment will be described with reference to a flowchart in FIG. 4 and results of an experiment in FIGS. 5A to 5C. When the process of FIG. 4 is started, first, depressions are formed in an undercoat film 2 that is an insulating film of $SiO_2$ (S10: the forming step). Next, an organic film 3 is embedded in the depressions of the undercoat film 2 by the gap fill (S12: the embedding step (first step)).

Next, etching is performed for a predetermined period of time under the condition in which selectivity between the organic film 3 and the undercoat film 2 is 1:1 or approximately 1:1 (S14: the etching step (second step)). Next, ashing of the organic film 3 is performed (S16: the removal step (the third step)). Next, metal interconnects are embedded in the depressions (S18).

[Experimental Result 1]

Hereinafter, results of an experiment performed using the treatment method according to one embodiment will be described. First, Experimental result 1, which is a result after the embedding step of embedding the organic film 3 in the depressions at S12 of FIG. 4, is illustrated in FIG. 5A. In this example, as a result of the embedding step, a level difference occurs between an organic film 3 deposited on the top 2a of the undercoat film 2 and an organic film 3 embedded in the depressions.

The organic film 3 may preferably be formed by the embedding step such that the maximum value a of a vertical thickness of the organic film 3 that is deposited on the top 2a of the undercoat film 2 is thicker than the thickness b of the organic film 3 that is the smallest thickness of the organic film 3 from the edge of the top of the undercoat film 2. That is, it is preferable that the organic film 3 is embedded such that a>b is established.

In addition, it is preferable that the sum (a+a') of the thickness a' of the undercoat film 2 from the bottom 2c to the top 2a of the undercoat film 2 and the maximum value a of the vertical thickness of the organic film 3 deposited on the top 2a of the undercoat film 2 is thicker than the minimum value c of the vertical thickness of the organic film embedded from the bottom 2b of the depression. In other words, it is preferable that the organic film 3 is embedded such that (a+a')>c is established.

In addition, it is preferable that the organic film 3 is embedded into the depression until the thickness c of the organic film 3 embedded in the depression is equal to or less than the thickness a' of the undercoat film 2. In other words, it is preferable that the organic film 3 is embedded such that c≤a' is established.

Figure 5B:
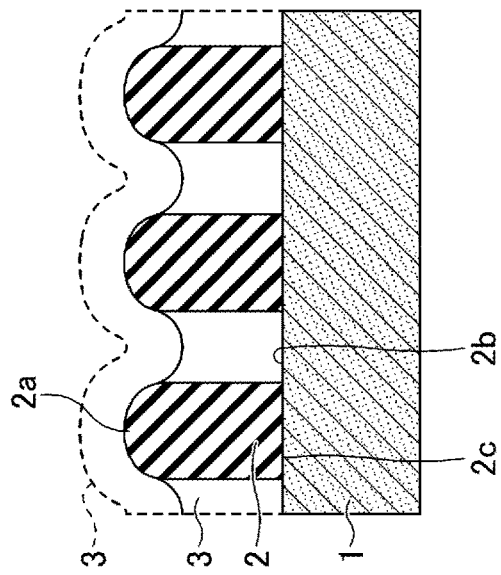

By the above-described embedding, if the undercoat film 2 and the organic film 3 are etched under the condition in which selectivity between the undercoat film 2 and the organic film 3 is 1:1 or approximately 1:1 in the etching step of S14 in FIG. 4, the upper portion of the undercoat film 2 can be formed into a rounded shape, as illustrated in FIG. 5B. Accordingly, as illustrated in FIG. 5C, after the organic film 3 is removed, an opening of the depression can be formed in a tapered shape.

[Experimental Result 2]

Next, with reference to FIG. 6, Experimental result 2, which illustrates states immediately after each of the embedding step of S12 (the first step), the etching step of S14 (the second step), and the removal step (the third step) of S16 is completed, will be described while comparing them with a comparative example.

Figure 6:
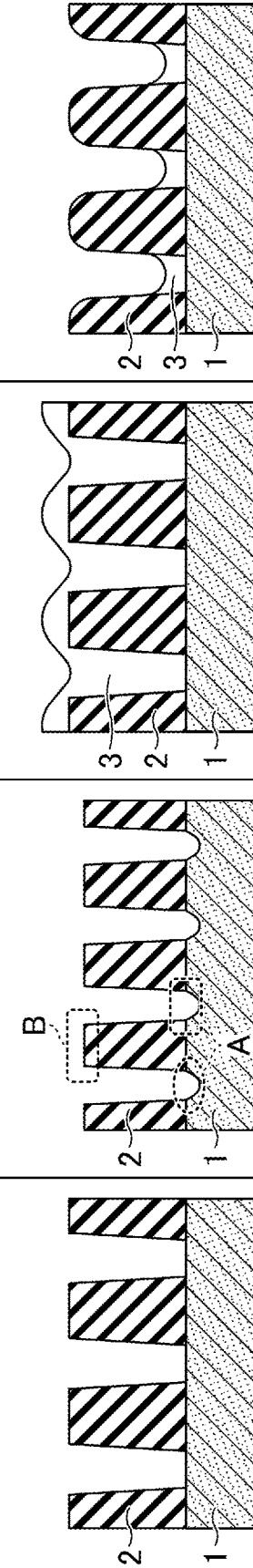
FIG. 6 is a diagram illustrating an example of results of experiments according to the embodiment and a comparative example.

Film structures illustrated in FIG. 6 indicate, from left to right, the initial state of a film, a state of the film after the second step has been performed in the comparative example, and a state of the film after the first step has been performed in the present embodiment, and a state of the film after the second step has been performed in the present embodiment.

The initial state is the same as the structure of the film described above. In the comparative example, only the second step was performed, and the first step of embedding the organic film 3 was not embedded. As a result, in the comparative example, as illustrated in the region B of FIG. 6, the upper portion of the undercoat film 2 was eroded, and the undercoat film 2 was reduced compared to the present embodiment. In the comparative example, as illustrated in the region A of FIG. 6, etching progressed at the bottom of the depression, and the shape of the depression deteriorated.

In contrast, in the present embodiment, as illustrated in the state of the film after the first step, etching of the second step was performed while a level difference was formed between an organic film 3 deposited on the top of the undercoat film 2 and an organic film 3 embedded in the depression. Accordingly, in the present embodiment, erosion as illustrated in the region A of the comparative example did not occur, and reduction of the undercoat film 2 as illustrated in the region B of the comparative example did not occur. Accordingly, in the present embodiment, while protecting a device shape of the lower portion of a film, a tapered shape can be formed at the opening of the depression of the undercoat film 2, as illustrated in the film state after the second step.

Figure 5C:
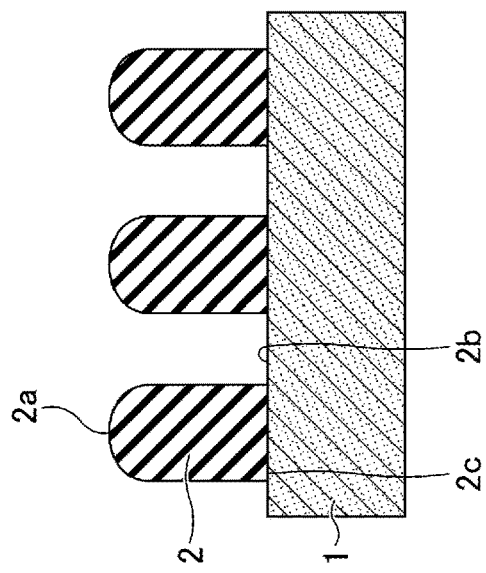

Therefore, in the treatment method according to the present embodiment, while a device shape of the lower portion of a film is protected, the shape in which the metal interconnect is easily embedded in the depression, as illustrated in FIG. 5C, can be formed.

[Experimental Result 3]

Figure 7:
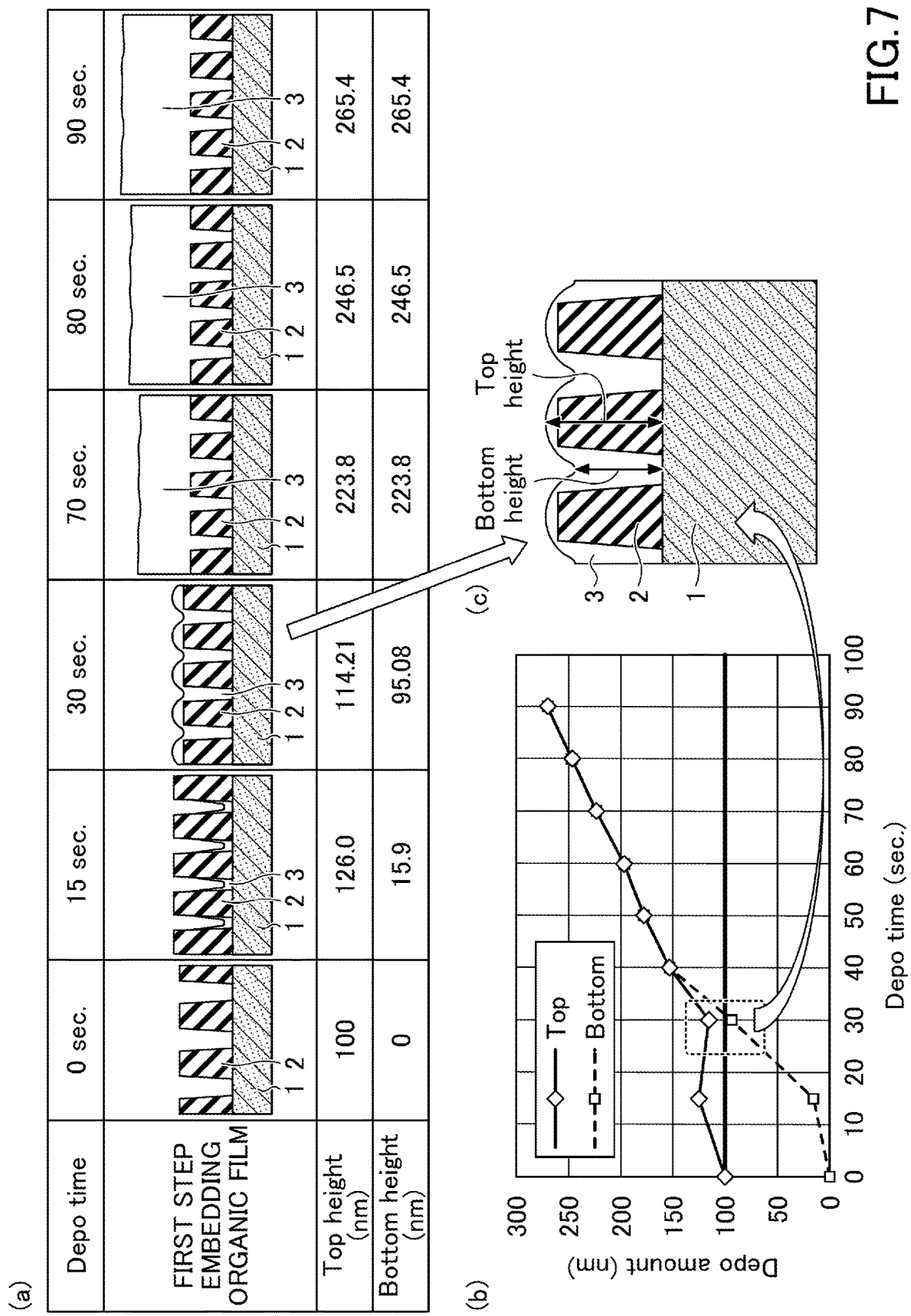
FIG. 7 is a diagram illustrating an example of results of an experiment regarding the embedding step according to the embodiment.

Next, Experimental result 3, which illustrates time dependence of the first step (the embedding step), will be described with reference to FIG. 7. The table (a) in FIG. 7 illustrates experimental results of states of the organic film 3 embedded when embedding time of the first step is changed from 0 seconds (initial state) to 90 seconds. Top height (nm) of the table (a) in FIG. 7 is indicated in the diagram (c) of FIG. 7. The top height (nm) represents the thickness corresponding to the portion (a+a') illustrated in FIG. 5A. Bottom height (nm) of the table (a) in FIG. 7 is indicated in the diagram (c) of FIG. 7. The bottom height (nm) represents the thickness c illustrated in FIG. 5A.

As a result of the difference between the top height and the bottom height, it has been found that, as the time of embedding (Depot time), approximately 30 seconds is an appropriate time for depositing the organic film 3, because the organic film 3 can be embedded in the depression such that an entirety of the undercoat film 2 or at least part of the undercoat film 2 can be covered with the organic film 3 and that the organic film 3 is recessed from the top of the undercoat film 2 toward the depression. In other words, it is preferable that the time of embedding the organic film 3 is set to a time in which the embedding step is stopped in a state in which a level difference is occurring between an organic film 3 deposited on the top of the undercoat film 2 and an organic film 3 deposited on the depression.

For example, as illustrated in the graph (b) of FIG. 7, the difference between the top height and the bottom height is 0 nm in a case in which the time of embedding (Depot time) is equal to or longer than 40 seconds. Therefore, as the time for embedding the organic film 3, it is preferable to set a time shorter than 40 seconds. More preferably, the time for embedding the organic film 3 is within a range from approximately 25 seconds to approximately 35 seconds.

[Experimental Result 4]

Next, Experimental result 4, which is a result of an experiment of variably controlling radio-frequency LF power for drawing ions that is applied to the mounting platform during the etching step as the second step, will be described with reference to FIG. 8.

In the comparative example in which the first step of embedding the organic film is not performed, etching was performed in the second step, while applying the radio-frequency LF power for drawing ions at less than 100 W. As a result, as illustrated in the region B of FIG. 8, the upper Portion of the undercoat film 2 was eroded, and the undercoat film 2 was reduced compared to the present embodiment. In the comparative example, as illustrated in the region A of FIG. 8, side-etching progressed at the bottom of the depression, and the shape of the depression deteriorated.

In contrast, in the present embodiment, after the first step of embedding the organic film was performed, etching was performed in the second step, while applying the radio-frequency LF power for drawing ions at less than 100 W. As a result, the thickness of the undercoat film 2 (Pattern height) was thicker than that of the comparative example, and reduction of the undercoat film 2 did not occur substantially compared to the initial condition. In the present embodiment, erosion (may also be referred to as "recess" in the following) was 0.0 nm, that is, a recess as illustrated in the region A of the comparative example was not generated.

Also, in the present embodiment, in the second step, etching was performed while applying the radio-frequency LF power for drawing ions at more than 100 W. As a result, the thickness of the undercoat film 2 (Pattern height) became thinner than that of the comparative example, and the upper portion of the undercoat film 2 became more rounded. However, recesses as illustrated in the region A of the comparative example were not generated.

From the above, it has been found that in the second step, the rounded shape of the upper portion of the undercoat film 2 can be controlled by controlling the radio-frequency LF power for drawing ions. Note that the duration of etching in the second step was controlled to a predetermined time.

As described above, in the treatment method according to the present embodiment, while a device shape of the lower portion of a film is protected, the shape of the depression of the undercoat film 2 can be formed such that the metal interconnect is easily embedded in the depression.

In the above description, the treatment method according to the present embodiment was used to optimize the shape of the depressions formed in the undercoat film of $SiO_2$ formed on the silicon film 1, but is not limited thereto. For example, the treatment method according to the present embodiment may be applied to various film structures such as the film structure illustrated in FIG. 9A.

In the film structure illustrated in FIG. 9A, a depression is formed in a Low-k film 6, which is an example of the undercoat film, using a TiN film 8 as a mask. Further, at the bottom of the depression formed in the Low-k film 6, a Cu film 7 is formed. In place of the Low-k film 6, a silicon film or a TiN film may be used.

In this state, in the first step, as illustrated in FIG. 9B, the organic film 3 is embedded in the depression of the Low-k film 6. As indicated by the dotted line in FIG. 9B, the first step is performed until a level difference is formed between an organic film 3 deposited on the top of the TiN film 8 and an organic film 3 embedded in the depression.

Next, in the second step, as illustrated in FIG. 9C, the organic film 3, the TiN film 8, and the Low-k film 6 are etched. At this time, because the Cu film 7 is protected by the organic film 3, it is possible to process the Low-k film 6 into a rounded shape while suppressing damage to the Cu film 7. Next, in the third step, as illustrated in FIG. 9D, the organic film 3 is removed by ashing. Accordingly, while protecting the device shape of the lower portion of a film, the shape of the depression of the Low-k film 6 can be formed so as to facilitate embedding of the metal interconnect into the depression.

[Plasma Processing Apparatus]

Finally, examples of the plasma processing apparatus 10 according to an embodiment, in which the treatment method according to the present embodiment is performed, will be described with reference to FIGS. 10A and 10B. FIGS. 10A and 10B each illustrate, as an example of the plasma processing apparatus 10 according to an embodiment, a simplified diagram of a parallel plate-type capacitive coupled plasma (CCP) processing apparatus.

First, the configuration of the plasma processing apparatus 10 illustrated in FIG. 10A will be described. The plasma processing apparatus 10 includes a vacuum vessel 11 and a mounting platform 12 disposed therein. The vacuum vessel 11 is a cylindrical vacuum container, which is formed of, for example, aluminum having a surface treated by anodic oxidation (anodizing treatment), and the vacuum vessel 11 is grounded. The mounting platform 12 includes a base 27 and an electrostatic chuck 13 placed on the base 27. The mounting platform 12 is disposed at the bottom of the vacuum vessel 11 via a support member 14 made of an insulating material.

The mounting platform 12 includes the base 27 and the electrostatic chuck 13. The base 27 is formed of aluminum or the like. The electrostatic chuck 13 is formed of a dielectric, such as alumina, and includes a mechanism that holds a wafer W with electrostatic attractive force. In the upper portion of the electrostatic chuck 13, an edge ring 15 that annularly surrounds the wafer W in the vicinity of the wafer W is provided at the outer circumference of the electrostatic chuck 13.

An annular exhaust path 23 is formed between the side walls of the vacuum vessel 11 and the side walls of the mounting platform 12, and is connected to an exhaust device 22. The exhaust device 22 is configured by a vacuum pump, such as a turbomolecular pump or a dry pump, to reduce the processing space in the vacuum vessel 11 to a predetermined vacuum level and to direct gas in the vacuum vessel 11 to the exhaust path 23 and an exhaust port 24. At the exhaust path 23, a baffle plate 21 is attached to the top or inlet of the exhaust path to separate the processing space from an exhaust space and to control a gas flow.

A first radio frequency power supply 17 and a second radio frequency power supply 18 are connected to the mounting platform 12. The first radio frequency power supply 17 applies power of a radio frequency HF for plasma generation having a frequency of, for example, 100 MHz, to the mounting platform 12. The second radio frequency power supply 18 applies power of a radio frequency LF for drawing ions having a frequency of, for example, 40 MHz, to the mounting platform 12. Accordingly, the mounting platform 12 also functions as a lower electrode.

A gas showerhead 16 is provided at the ceiling of the vacuum vessel 11. The gas showerhead 16 also functions as an upper electrode at a ground potential. Thus, power of a radio frequency HF for plasma generation from the first radio frequency power supply 17 is capacitively applied between the mounting platform 12 and the gas showerhead 16.

A gas supply source 19 supplies gas according to process conditions of each process, such as the etching step, the film forming step, and the ashing step. Gas enters the gas showerhead 16 from a gas inlet via a gas line 20, passes through a gas diffusion chamber 25, and is introduced into the vacuum vessel 11 through a large number of gas vents 26 in a shower-like manner.

The plasma processing apparatus 10 according to one embodiment illustrated in FIG. 10B has substantially the same configuration as the plasma processing apparatus 10 according to one embodiment illustrated in FIG. 10A, and differs only in the arrangement of the first radio frequency power supply 17. That is, in the plasma processing apparatus 10 of FIG. 10B, the first radio frequency power supply 17 is connected to the gas showerhead 16. The first radio frequency power supply 17 applies power of the radio frequency HF power for plasma generation having a frequency of, for example, 60 MHz.

A controller 30 includes a CPU, a ROM (Read Only Memory), and a RAM (Random Access Memory). The controller 30 controls processes such as etching and deposition, and controls an entirety of the apparatus, in accordance with procedures set in a recipe stored in the RAM.

In performing plasma processing in the plasma processing apparatus 10 of such configurations, a wafer W is first loaded into the vacuum vessel 11 from a gate valve, while the wafer W is held by a transport arm. The wafer W is placed on the electrostatic chuck 13. The gate valve is closed after the wafer W is loaded. By applying direct-current (DC) voltage to an electrode of the electrostatic chuck 13, the wafer W is attracted to and held on the electrostatic chuck 13 by Coulomb force.

The pressure in the vacuum vessel 11 is reduced to a set value by the exhaust device 22, and the inside of the vacuum vessel 11 is controlled to be in a vacuum state. A predetermined gas is introduced into the vacuum vessel 11 from the gas showerhead 16 in a shower-like manner. Power of a radio frequency HF and power of a radio frequency LF are applied to the mounting platform 12.

A plasma is generated from the introduced gas, mainly by the power of the radio frequency HF, and processing, such as etching or deposition, is applied to the wafer W by action of the plasma. After all processes are completed, the wafer W is held by the transport arm, and is unloaded to the outside of the vacuum vessel 11. By repeating the above processes, wafers W are processed successively.

However, an apparatus capable of performing the treatment method according to one embodiment is not limited to the plasma processing apparatus 10. A device capable of executing the treatment method according to an embodiment is applicable to any of the following types: Capacity Coupled Plasma (CCP), Inductively Coupled Plasma (ICP), Radial Line Slot Antenna (RLSA), Electron Cyclotron Resonance Plasma (ECR), and Helicon Wave Plasma (HWP).

[Treatment in the Same Vacuum Vessel]

In the treatment method according to an embodiment, in a case in which the embedding step employs the gap fill embedding technique, the forming step, step, the embedding step, the etching step, and the removal step can be performed without breaking vacuum.

For example, the forming step, the embedding step, the etching step, and the removal step may be performed successively in the same vacuum vessel. This eliminates time used in transporting a wafer W to another vacuum vessel, and improves productivity.

For example, a wafer W may be conveyed in a vacuum environment, and the forming step, the embedding step, the etching step, and the removal step may each be performed in a different vacuum vessel. If a wafer W is exposed to an atmosphere, halogen-based (fluorine or chlorine) reaction products, which have adhered to the wafer W in the second step, react with moisture or oxygen in the atmosphere and the reaction products grow. As a result, generation of particles is likely to occur. According to the present embodiment, by performing the forming step, the embedding step, the etching step, and the removal step without breaking vacuum, generation of particles can be suppressed. Further, by performing without breaking vacuum, management of a time limit (Q-time), which is the resting time between the end of a certain step and the next step, and wet cleaning of F or C adhering to the surface of the wafer W are rendered unnecessary.

The treatment method according to an embodiment disclosed herein is to be considered exemplary in all respects and not restrictive. The above embodiment may be modified and enhanced in various forms without departing from the scope of the appended claims. Matters described in the above embodiment may take other configurations to an extent not inconsistent, and may be combined to an extent not inconsistent.

The present specification has described a case in which a wafer is an example of a substrate. However, the substrate may not be limited thereto, but may be various substrates used in an FPD (Flat Panel Display), a printed circuit board, or the like.

This international application is based on and claims priority to Japanese Patent Application No. 2018-155797, filed on Aug. 22, 2018, the entire contents of which are incorporated herein by reference.

DESCRIPTION OF SYMBOLS

1 Silicon film
2 Undercoat film
3 Organic film
5 Hole
6 Low-k film
7 Cu film
8 TiN film
10 Plasma processing apparatus
12 Mounting platform
11 Vacuum vessel
17 First radio frequency power supply
18 Second radio frequency power supply

What is claimed is:

1. A treatment method comprising:
    embedding an organic film on an undercoat film in which a recess is formed, said undercoat film being provided on a silicon film and including a first face which abuts the silicon film and a second face that is opposite to the first face, said second face having the recess that deepens toward the first face; and after the embedding of the organic film, etching the organic film until a corner portion that extends along an opening of the recess and is formed by the second face and the recess of the undercoat film is exposed, thereby making the corner portion tapered, wherein in the embedding of the organic film, a level of the organic film within the recess relative to the first face is lower than a level of the organic film deposited on the second face of the undercoat film relative to the first face in a direction perpendicular to the first face, said organic film being deposited on the second face of the undercoat film while embedding the organic film on the undercoat film, and wherein the embedding includes placing a workpiece on a mounting platform cooled to −20° C. or less in a vacuum vessel;

supplying, into the vacuum vessel, a process gas containing a carbon-containing gas;

forming the supplied process gas into a plasma; and emitting, onto the workpiece, a precursor generated from the process gas by the plasma.

2. The treatment method according to claim 1, wherein the organic film is embedded such that the organic film is recessed from the second face of the undercoat film toward the recess.

3. The treatment method according to claim 1, wherein the organic film is embedded such that a vertical thickness of a portion of the organic film deposited on the second face of the undercoat film is greater than a shortest distance from an edge of the second face of the undercoat film to a surface of the organic film.

4. The treatment method according to claim 1, wherein the organic film is embedded such that a sum of a thickness of the undercoat film from the first face of the undercoat film to the second face of the undercoat film and a vertical thickness of a first portion of the organic film deposited on the second face of the undercoat film in the direction is greater than a vertical thickness of a second portion of the organic film embedded from g bottom of the recess in the direction.

5. The treatment method according to claim 1, wherein the organic film is embedded such that a thickness of a portion of the organic film embedded in the recess in the direction is equal to or less than a thickness of the undercoat film from the first face of the undercoat film to the second face of the undercoat film.

6. The treatment method according to claim 1, wherein in the etching, the undercoat film is etched such that the second face of the undercoat film becomes rounded.

7. The treatment method according to claim 1, wherein in the etching, the undercoat film and the organic film are etched under a condition in which selectivity between the undercoat film and the organic film becomes 1:1.

8. The treatment method according to claim 1, further comprising removing the organic film.

9. The treatment method according to claim 8, further comprising before the embedding of the organic film, forming the recess by etching the undercoat film using a mask on the undercoat layer.

10. The treatment method according to claim 1, wherein the organic film remains on the second face of the undercoat film after making the corner portion tapered.

11. A treatment method comprising:

embedding an organic film on an undercoat film in which a recess is formed, said undercoat film being provided on a silicon film and including a first face which abuts the silicon film and a second face that is opposite to the first face, said second face having the recess that deepens toward the first face; and after the embedding of the organic film, etching the organic film until a corner portion that extends along an opening of the recess and is formed by the second face and the recess is exposed, thereby making the corner portion tapered; wherein the organic film is embedded such that a vertical thickness of a portion of the organic film deposited on the second face of the undercoat film in a direction perpendicular to the second face is greater than a shortest distance from the corner portion of the undercoat film to a surface of the organic film; and the embedding including placing a workpiece on a mounting platform cooled to −20° C. or less in a vacuum vessel;

supplying, into the vacuum vessel, a process gas containing a carbon-containing gas;

forming the supplied process gas into a plasma; and emitting, onto the workpiece, a precursor generated from the process gas by the plasma.

* * * * *